United States Patent [19]
Kojima et al.

[11] Patent Number: 5,930,183
[45] Date of Patent: *Jul. 27, 1999

[54] SEMICONDUCTOR MEMORY DEVICE

[75] Inventors: Kazumi Kojima, Kasugai; Toshiya Uchida, Kawasaki, both of Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/978,374

[22] Filed: Nov. 25, 1997

[30] Foreign Application Priority Data

May 30, 1997 [JP] Japan ................................. 9-141368

[51] Int. Cl.$^6$ ............................ G11C 7/00; G11C 16/04; G11C 8/00
[52] U.S. Cl. ................ 365/200; 365/189.05; 365/230.03
[58] Field of Search .............................. 365/200, 189.05, 365/189.07, 225.7, 230.06, 230.08, 230.03

[56] References Cited

U.S. PATENT DOCUMENTS

| | | | |
|---|---|---|---|
| 4,748,594 | 5/1988 | Iida | 365/200 |
| 5,097,447 | 3/1992 | Ogawa et al. | 365/200 |
| 5,357,458 | 10/1994 | Yu et al. | 365/189.07 |
| 5,359,560 | 10/1994 | Suh et al. | 365/200 |
| 5,485,424 | 1/1996 | Kawamura | 365/200 |
| 5,617,364 | 4/1997 | Hatakeyama | 365/200 |

FOREIGN PATENT DOCUMENTS 0 679 996A2  11/1995  European Pat. Off. .

*Primary Examiner*—Trong Phan
*Attorney, Agent, or Firm*—Nikaido, Marmelstein, Murray & Oram LLP

[57] ABSTRACT

According to the present invention, there is provided a semiconductor memory device comprising a memory cell array and a redundant memory cell array in which a defective cell in the memory cell array is substituted by a cell in the redundant memory cell array; further comprising: a PROM circuit in which a redundant address corresponding to the defective cell is recorded; a redundant address data holding circuit that holds the data of the redundant address recorded in the PROM circuit on initialisation; a circuit for deciding on redundancy that compares the data held by the redundant address data holding circuit with an address supplied from outside and makes a decision; and a driver circuit for the memory cell array that is actuated in accordance with the result of this decision by the circuit for deciding on redundancy and a driver circuit for the redundant memory cell array. Since a semiconductor memory device as above does not have a PROM circuit that delays the operation in the circuit for deciding on redundancy, high-speed operation of the circuit for deciding on redundancy can be achieved. As a result, overall access time can be reduced.

9 Claims, 7 Drawing Sheets

FIG.10
PROR ART

REDUNDANCY DECISION CIRCUIT 24

SEMICONDUCTOR MEMORY DEVICE

BACKGROUND OF THE INVENTION

1. Field of the Invention

The present invention relates to a semiconductor memory device such as a dynamic random access memory (DRAM) and more particularly relates to a semiconductor memory device wherein, when redundant memory is provided, access time can be shortened and furthermore redundancy efficiency can be raised even when capacity is large.

2. Description of the Related Art

The capacity of semiconductor memory devices such as DRAMs is continually being increased. It has recently been reported that capacity has reached 1 Gigabit. In such large-capacity memories, redundant memory is provided in order to raise yield by rescuing defective bits, defective word lines, and defective bit lines. In particular, rescue of fixed defects produced by short-circuiting or disconnection of word lines or bit lines due to process factors is adopted in practically all memories. And in recent years techniques have even been proposed to substitute with cells of redundant memory defective bits whose refresh period has become short.

A memory including such a redundant memory has a circuit for deciding on redundancy wherein addresses to be substituted are stored in a PROM or the like, to decide whether these coincide with an input address or not. Typically such a circuit for deciding on redundancy is a circuit in which PROM elements such as fuses are incorporated at various different places in the circuit.

Figure 9:
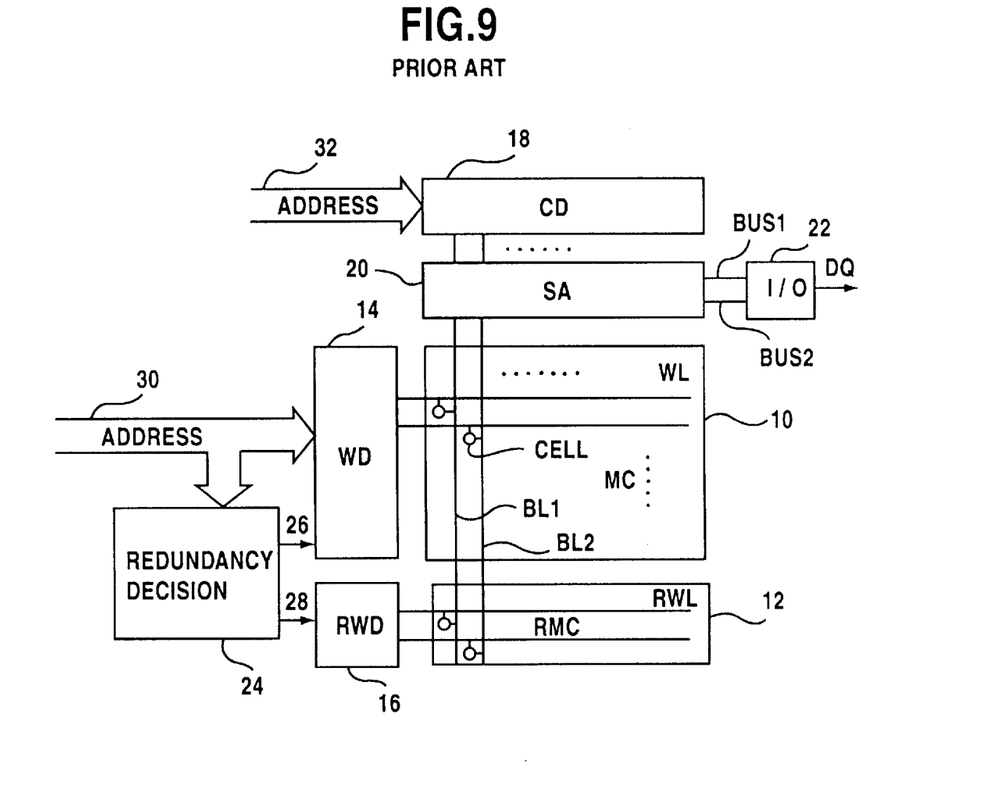
FIG. 9 is a view showing a diagrammatic layout of a conventional memory having redundant memory.

FIG. 9 is a layout diagram of a prior art memory provided with redundant memory. In this example, a redundant memory cell array 12 is provided in addition to memory cell array 10. In this case, as an example, only the redundant structure on the row side is shown. A word line WL in memory cell array 10 is selected and driven by a row decoder driver 14 that is supplied with a row address 30. The memory data of a memory cell provided at the point of intersection of word line WL and bit lines BL1, BL2 is then read onto bit lines BL1, BL2, sensed and amplified by sense amplifier 20 and applied to input/output circuit 22 through data buses Bus1, Bus2 and output from input/output terminal DQ. The output of sense amplifier 20 is selected by means of column decoder driver 18, which is supplied with a column address 32.

A defective word line is substituted with a redundant word line RWL in the redundant memory cell array. A row address corresponding to a defective word line is recorded in PROM in a circuit for deciding on redundancy 24. Circuit for deciding on redundancy 24 determines whether or not a supplied row address coincides with a recorded address.

Figure 10:
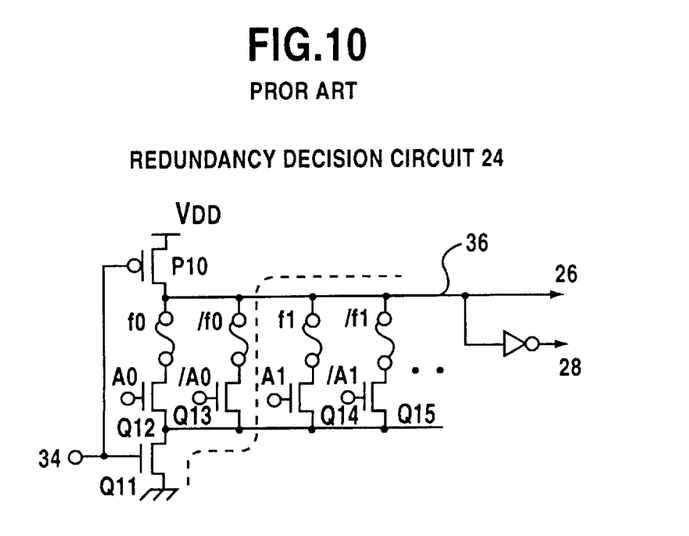
FIG. 10 is a view showing an example of a circuit for deciding on redundancy.

FIG. 10 is a view showing an example of this circuit for deciding on redundancy. This circuit basically has an NOR circuit structure and comprises fuses f0, /f0, f1, /f1 constituting PROM cells that store a substitute address and N type transistors $Q_{12}$, $Q_{13}$, $Q_{14}$ and $Q_{15}$ to the gates of which an address is applied from outside, connected in series. P type transistor $P_{10}$ and N type transistor $Q_{11}$ are the circuits that activate the circuit for deciding on redundancy 24 by H level of redundancy decision timing signal 34.

Let us now provisionally assume that fuses f0 and f1 are melted if the substitution address is (A0, A1). Thereupon the operation of this circuit is as follows: redundancy decision timing signal 34 is normally L level and transistor $Q_{11}$ is non-conductive, its output 36 being H level. When an address signal is then applied from outside, causing redundancy decision timing signal 34 to become H level, H level of output 36 is maintained only if the external address is (A0, A1)=(1, 1); if an address other than this is applied, a current path as shown by the broken line in the drawing is generated, causing output 36 to become L level. Signal 26 that selects memory cell array 10 is therefore L level in selection, and the signal 28 that selects redundant memory cell array 12 also goes into L level in selection.

As described above, in circuit for deciding on redundancy 24, PROM elements such as fuses which have large resistance or capacitance are present on the critical path of address determination, so the time required to determine the level of output 36 is long. Since, as shown in FIG. 9, a word decoder driver is selected by a decision signal 26, 28 after decision whether the address 30 from outside is the same as a substitution address or not, the speed of circuit for deciding on redundancy 24 is low, making the memory access time long.

Furthermore, if the number of addresses that must be compared by the circuit for deciding on redundancy 24 is large, the scale of the circuit for deciding on redundancy 24 needed for redundant memory becomes large. On the other hand, it is common structure in a large-capacity memory that the memory is divided for example into a plurality of banks, and each bank is further divided into a plurality of blocks. In this way, if the memory cell array is divided into a plurality and a redundant memory cell array is provided for each block, the number of addresses of the circuit for deciding on redundancy can be made small, enabling its scale to be reduced and so raising its speed of operation.

However, the redundant memory cell array provided for each block can only be used to substitute defective cells within the corresponding block. However, defective bit and/or defective word lines are not always generated in dispersed manner but may occur concentrated in a few blocks. And in fact defective bit and/or defective word lines can even occur in the redundant memory cell array itself.

Under these circumstances, with a memory cell array that is implemented in the form of small blocks, if redundant memory cell arrays are provided for each of these, the probability of rescue of defective bits or defective words is lowered. As mentioned above, if defects are present in the redundant memory cell array, the probability of rescue is to that extent lowered. Also, if defects are concentrated in a specific block, the capacity of the redundant memory at the specific block may be insufficient, making rescue impossible.

SUMMARY OF THE INVENTION

An object of the present invention is therefore to provide a semiconductor memory device wherein the time required for redundancy decision can be shortened.

A further object of the present invention is to provide a semiconductor memory device wherein the circuit for deciding on redundancy can be reduced in size, enabling its operating time to be shortened and the probability of redundancy rescue to be raised.

In order to achieve the above object according to the present invention, there is provided a semiconductor memory device including a memory cell array and a redundant memory cell array, comprising:

a PROM circuit for storing a redundant address corresponding to a defective cell in the memory cell array;

a redundant address data holding circuit for holding the data of the redundant address stored in the PROM circuit on initialisation;

a circuit for deciding on redundancy that compares the data held by the redundant address data holding circuit with a supplied address; and a driver circuit for the memory cell array and a driver circuit for the redundant memory cell array that are actuated in accordance with the result of the decision by the circuit for deciding on redundancy.

Since a semiconductor memory device as above does not have a PROM circuit that delays the operation in the circuit for deciding on redundancy, high-speed operation of the circuit for deciding on redundancy can be achieved. As a result, overall access time can be reduced.

Furthermore, in a semiconductor memory device as above, a latch signal may be generated in response to a mode register set command supplied from outside on the initialisation and the data of the redundant address recorded in the PROM circuit may be held in the redundant address data holding circuit in response to the latch signal.

Further according to a second aspect of the present invention, in order to achieve the above object, there is provided a semiconductor memory device, divided into a plurality of memory cell blocks in accordance with row address wherein the memory cell blocks respectively comprise a memory cell array, a redundant memory cell array and a word driver that respectively driving the memory cell array and the memory cell array and redundant memory cell array are divided into a plurality in the column direction, comprising:

a circuit for deciding on redundancy deciding whether or not a supplied address corresponds to a recorded redundant address;

a substitution data holding circuit for holding substitution data indicating substitution/non-substitution to a redundant memory cell for each memory cell array divided in the column direction; and wherein the word driver drives one or other of the memory cell array or redundant memory cell array divided in the column direction, in accordance with the output of the circuit for deciding on redundancy and the output of the substitution data holding circuit.

By division into a plurality of memory cell blocks, the number of addresses of the circuit for deciding on redundancy can be reduced, enabling it to be speeded up, and lowering of the probability of rescue of the redundant memory cell arrays provided for each memory cell block can be prevented.

BRIEF DESCRIPTION OF THE DRAWINGS

FIG. 2 is a timing chart showing the operation when the power source voltage is turned on;

DESCRIPTION OF THE PREFERRED EMBODIMENTS

Embodiments of the present invention are described below with reference to the drawings. However, the technical range of the present invention is not restricted to these embodiments.

Figure 1:
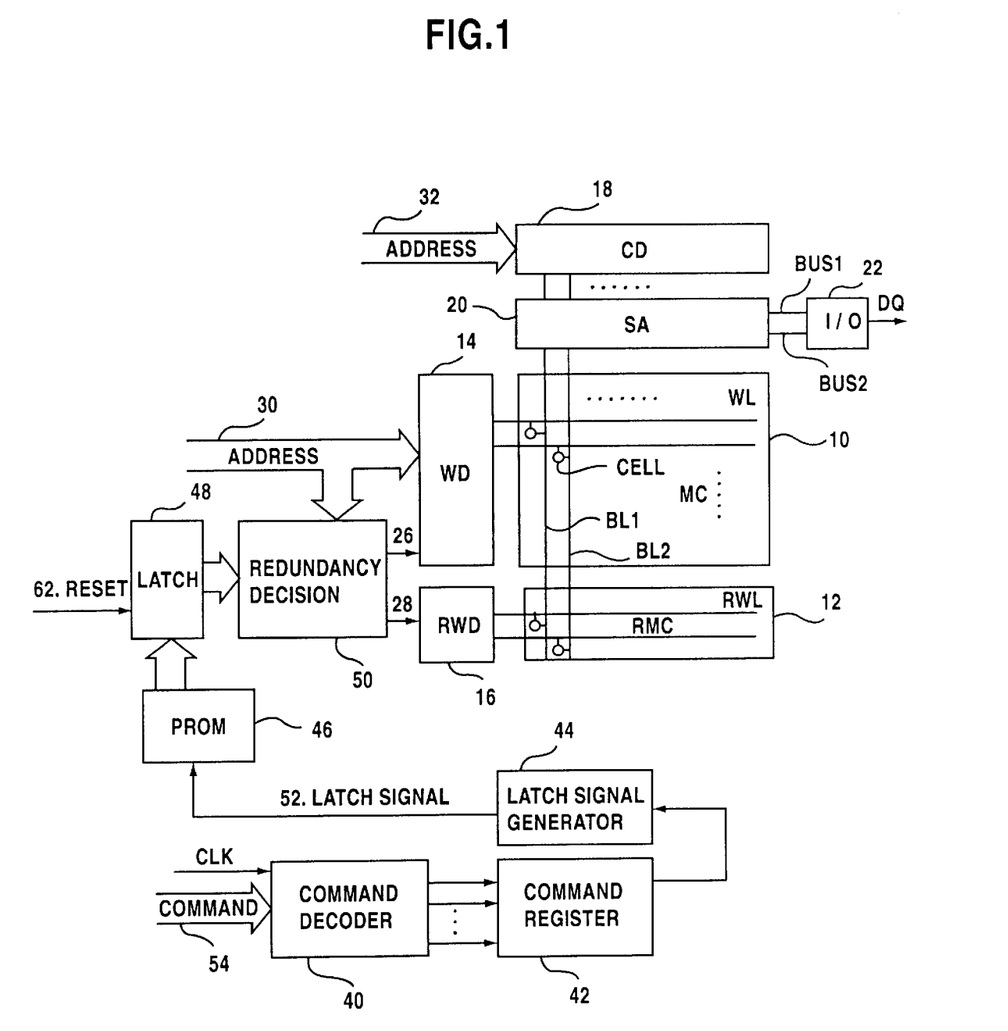
FIG. 1 is a diagrammatic circuit view of a semiconductor memory device according to an embodiment of the present invention.

FIG. 1 is an outline circuit diagram of a semiconductor memory device according to an embodiment of the present invention. Portions corresponding to the circuit diagram of FIG. 9 illustrating the prior art example are given the same reference symbols. In this example, the data of memory 46 such as a PROM that stores addresses substituted by redundant cells is recorded in a latch circuit 48 in response to a latch signal 52 generated on memory initialisation. This latch circuit 48 does not contain memory elements such as fuses whose stray capacitance or stray resistance is high and which would cause operation to be slowed down. The latch data in latch circuit 48, which is capable of high-speed operation, and the row address 30, which is supplied from outside, are therefore compared by circuit for deciding on redundancy 50, which makes a decision as to whether these are the same or not. Selection signals 26, 28 are generated in accordance with the result of this decision.

The present invention is a synchronous DRAM (SDRAM). The SDRAM is known as a high speed operation memory that inputs an operation command, address signals and an input data and outputs an output data in synchronous with a clock signal given by a system.

In general when an SDRAM is powered up, synchronously with the rise of the clock CLK supplied from the system, a commands 54 corresponding to the operating mode is supplied from the system. The command 54 is then decoded by an incorporated command decoder 40 and the data of the corresponding operating mode is saved in a command register 42. In the operating modes there are for example a mode in which only data corresponding to a given address is output and a mode in which 8-bit data subsequent to a given address is output. A memory operating mode can therefore be specified by a combination of commands from the system and prescribed output operation etc. can be conducted in response to data or an address supplied by the system under this operating mode.

The command to set up the aforesaid operating mode is called the mode register set (MRS) command. Thereupon, in the present embodiment, when the power source is turned ON, latch signal generating unit 44 generates latch signal 52, in response to the mode register set command supplied by the system, and address data corresponding to the substituted cell or substituted word line is read into latch circuit 48 from PROM 46.

Figure 2:
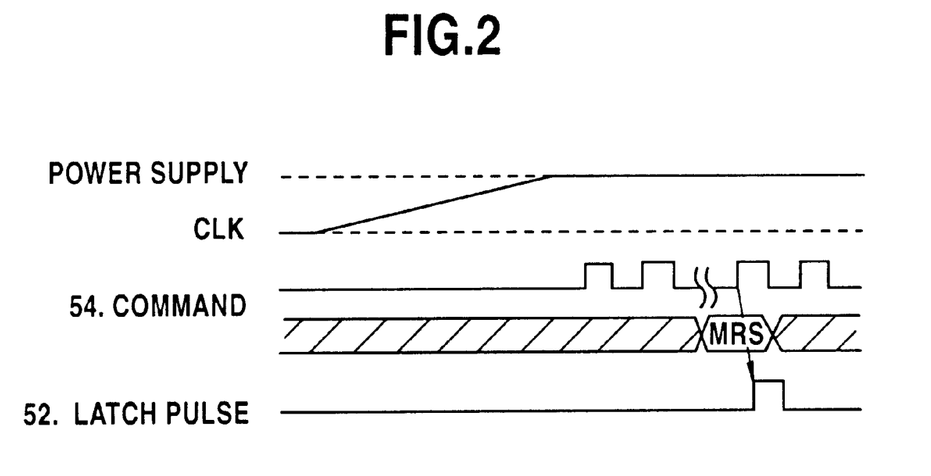

FIG. 2 is a timing chart showing the operation on rise of the power source voltage as mentioned above. In response to rise of the power source voltage, the mode register set command MRS synchronised with the clock CLK from the system is applied as command 54 and a prescribed operating mode is thereby set in command register 42, whereupon the latch signal 52 is generated by latch signal generating circuit 44.

Application of this embodiment is not restricted to SDRAM and it can be applied to memories in general. The essential is that it should be possible to generate a latch signal 52 by some method or other in the initial stage when the power source voltage is rising and that redundant address data should be capable of being written to latch circuit 48 from PROM 46 in response to this latch signal 52.

Figure 3:
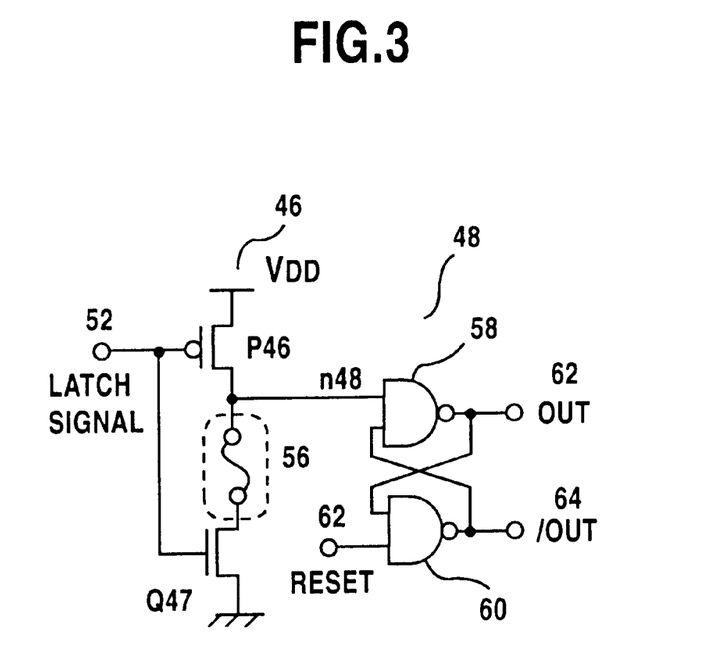
FIG. 3 is a circuit diagram showing an example of a PROM and a latch circuit.

FIG. 3 is a circuit diagram showing an example of PROM 46 and latch circuit 48. In this example, PROM circuit 46 is provided with an N type transistor $Q_{47}$ and fuse elements 56 and a P type transistor $P_{46}$ connected between ground and power source $V_{DD}$. Latch signal 52 is applied to the gates of both transistors. The redundancy address is stored in fuse elements 56. Also, latch circuit 48 is formed by cross-connecting the output and input terminals of NAND gates 58 and 60. The output of PROM circuit 46 is connected to one input terminal of NAND gate 58. The input terminal of the other NAND gate 60 is supplied with a reset signal 62 that is generated on rise of the power source voltage.

Regarding the operation of this circuit, in the ordinary condition, latch signal 52 is L level and the output terminal n48 of the PROM circuit is at H level due to P type transistor $P_{46}$ being in conductive condition. Transistor $Q_{47}$ thereupon conducts in response to an H level latch signal 52 generated on rise of the power source voltage, with the result that the level of output n48 becomes either H level or L level depending on whether fuse element 56 is in open condition or short-circuited condition. The logic level of this output n48 is latched in latch circuit 48. This latch data is held so long as the power source voltage does not drop.

This latch circuit can be constituted in simple manner using two ordinary NAND gates constituted for example by CMOS circuits. Incorporation of latch circuit 48 does not therefore itself create much of a problem regarding density of circuit integration.

Figure 4:
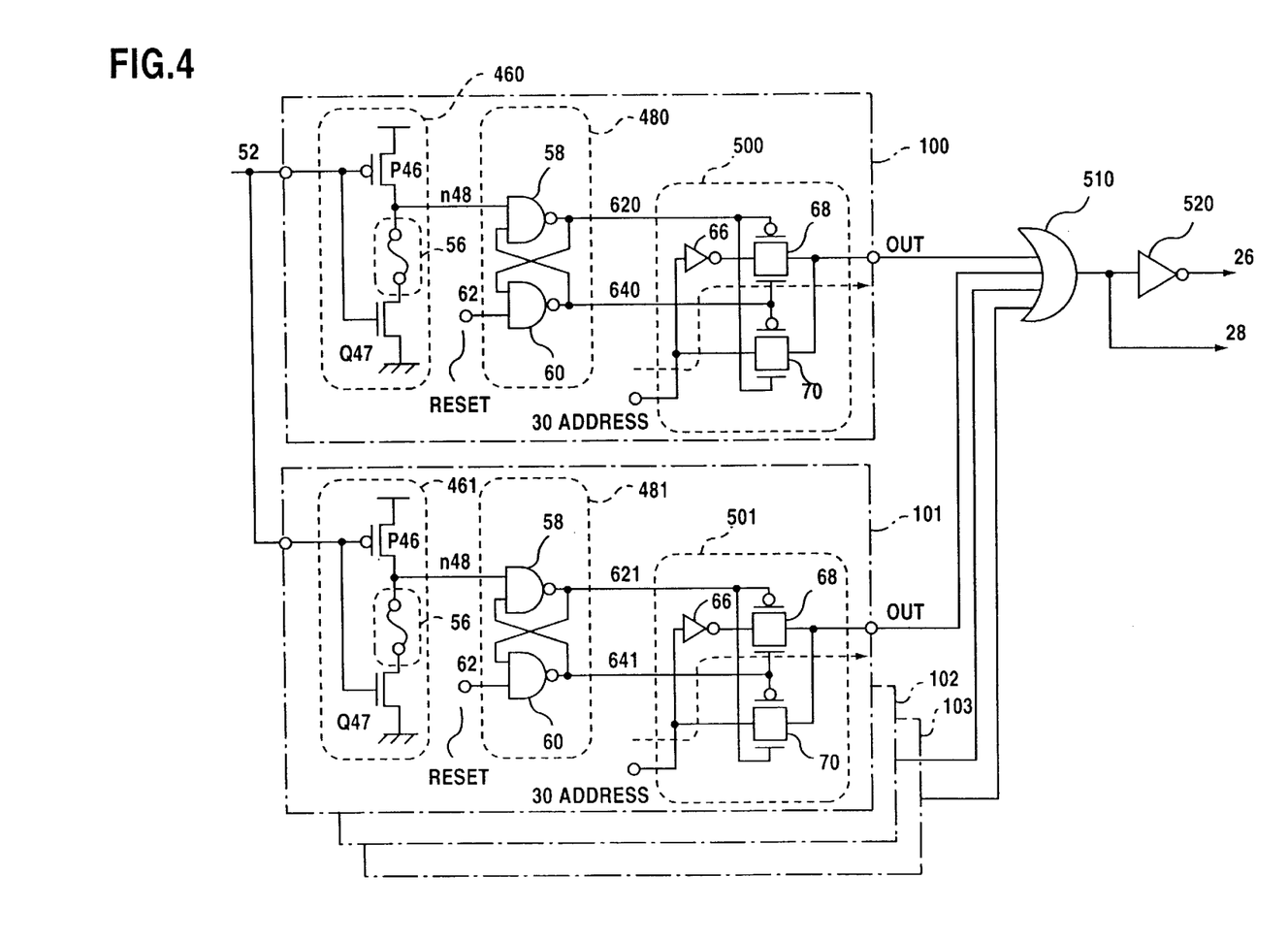
FIG. 4 is a circuit diagram showing an example of a PROM, a latch circuit and a circuit for deciding on redundancy.

FIG. 4 is a view showing an example of PROM circuit 46, latch circuit 48 and circuit for deciding on redundancy 50. In this Figure, circuit for deciding on redundancy 50 is constituted by decision circuits 500, 501 provided for each address bit and an OR gate 510 that inputs the respective outputs out of these decision circuits. Inverter 520 is provided for forming inverted logic.

Each respective address bit unit 100, 101, 102, 103 has PROM circuits 460, 461 and latch circuits 480, 481. The construction of these circuits is the same as described in FIG. 3, so the same reference symbols are used.

Within decision circuits 500, 501, there are provided CMOS switches 68, 70 which are ON/OFF controlled in complimentary manner by complimentary output signals 620, 640 or 621, 641 from the latch circuits. These CMOS switches 68, 70 are supplied with positive-phase and negative-phase signals of row address 30 from outside. 66 is an inverter circuit. Then, depending on the data that is written to fuse element 56, one of CMOS switches 68, 70 conducts and the address or its inverted signal 30 corresponding to the conducted CMOS switch 68, 70 is generated at output out.

Let us now provisionally assume that the corresponding redundant address in address bit unit 100 is H level and that fuse element 56 was melted. In this case, even if latch signal 52 becomes H level, output n48 stays at H level. Consequently, in latch circuit 480, output 620 becomes L level and output 640 becomes H level. As a result, CMOS switch 68 is in the conductive condition, switch 70 is in non-conductive condition. If thereupon we assume that the address 30 supplied from outside is H level, the L level inverted by inverter 66, passing through switch 68 which is in conductive condition, makes the output out of address bit unit 100 L level.

As described above, if the supplied address and the stored address coincide at all the address bit units, all their outputs out become L level. Consequently the output of OR gate 510 becomes L level and the H level non-selection signal 26 inverted by inverter 520 is applied to decoder driver 14 of defective word line WL and the L-level selection signal 28 is applied to word decoder driver 16 on the redundant side. As a result, redundant word line RWL is driven and drive of defective word line WL is not performed.

As is clear from the circuit shown in FIG. 4, the comparison and decision process which the redundant address data latched in the latch circuit and the row address 30 obtained from outside or internally are subjected to is performed by decision circuits 500, 501 which do not contain elements such as fuses which would slow down the operating speed. The operation of address determination can therefore be conducted at high speed. The data in the PROM circuits in which the redundant address is stored are loaded into latch circuits 480, 481 in response to latch signal 52 at the stage of the initial rise in voltage of the power source. Since this loading action is a circuit operation which is conducted by means of fuse elements 56, it cannot be performed at high speed. However, once the substitution address has been latched in the latch circuit 480, 481, the address determination operation for each subsequent access does not have to go through a fuse element and can therefore be performed at very high speed. In particular, if the memory is made of large capacity, the number of addresses to be determined is increased. This therefore means that the high speed of performance of the decision operation at each address enables the decision operation for the totality of addresses to be performed at high speed.

[Second Embodiment]

However, even if the respective address bit units of the circuit for deciding on redundancy shown in FIG. 4 are high-speed, if the number of addresses in respect of which a decision is to be made is large, the overall decision operation will be attended by a certain delay. This may cause for example problems of skewing at the respective address bit units. Furthermore, increasing the number of addresses means that the scale of the circuit for deciding on redundancy shown in FIG. 4 becomes large.

Figure 5:
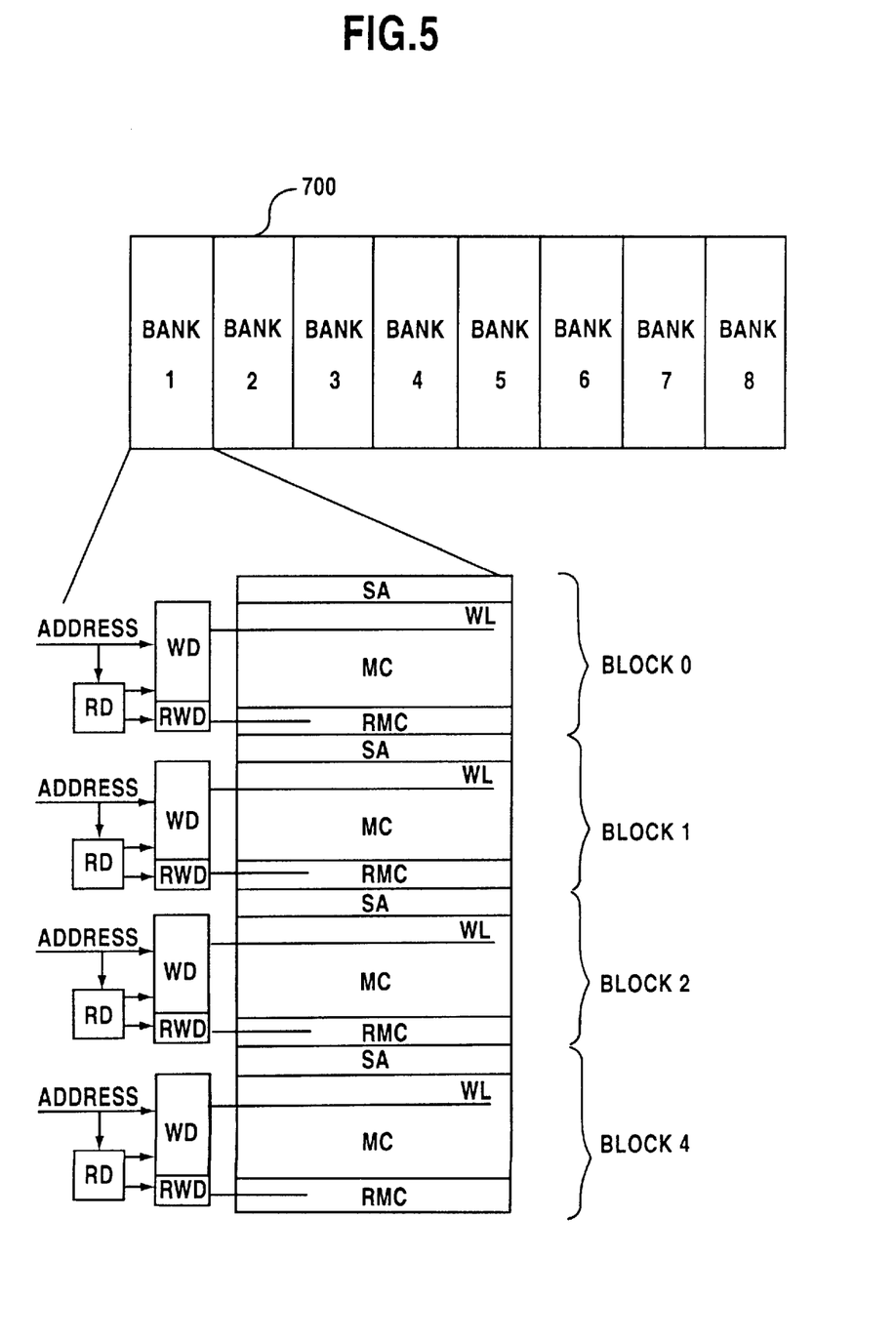
FIG. 5 is a view showing memory cell banks of a large-capacity semiconductor memory device and an example of division into memory cell blocks.

FIG. 5 is a view showing an example of a memory cell bank of a large-capacity semiconductor memory device and an example of memory cell block division. In this example, memory device 700 is divided into eight memory cell banks Bank1~8. And as shown in the FIG. 5, the respective memory cell banks are further subdivided into four memory cell blocks Block0~3. As shown in FIG. 1, each memory cell block Block has a memory cell array MC, word decoder driver WD, sense amplifier SA, redundant memory cells RMC, redundant word decoder driver RWD and circuit for deciding on redundancy RD.

As described with reference to FIG. 1, the operation of each memory cell block Block is as follows: the address supplied from outside or internally is compared with the stored redundancy addresses in the circuit for deciding on redundancy RD and a decision is made as to whether or not a defective memory cell being subject of substitution to redundant memory is being accessed. The redundant memory cells RMC provided for each memory cell block Block are therefore employed to rescue the defective cells of the memory cell array MC or defective word lines within the corresponding memory cell block. In other words, there is no possibility of for example the redundant memory cell array RMC of memory cell block Block0 being substituted for defective cells or defective word lines of a memory cell array in a block Block1~3 other than memory cell block Block0.

In a large-capacity memory, as shown in FIG. 5, the number of addresses corresponding to each memory cell block can be reduced by dividing the memory cell array into a plurality of arrays. This reduces the number of addresses that need to be compared in the circuit for deciding on redundancy RD, so the scale of the circuit for deciding on redundancy RD can be reduced and operation at high speed can be achieved.

However, if a large number of divisions of the memory cell are made, this tends to give rise to the problem that the probability of defect recovery being achieved by a redundant memory cell array is lowered. Specifically, firstly, as the number of divisions is increased, the redundant memory cell arrays provided for each memory cell block become of small capacity, with the result that, if a defect occurs in a redundant memory cell array, the probability of being able to rescue a defective cell or defective word line in this memory cell block is lowered.

Secondly, occurrence of defective cells or defective word lines may be concentrated in a particular memory cell block rather than being uniformly distributed over all memory cell blocks. In these circumstances, the redundant memory cell array belonging to this memory cell block will not be capable of rescuing all the defective cells in the memory cell block.

Accordingly, in this embodiment, in a construction wherein a plurality of bits are simultaneously output as for example in the case of 16-bit output, the probability of rescue of defective cells by the redundant memory cell array is raised by effecting the division of the memory cell arrays and redundant memory cell arrays in the column direction.

Figure 6:
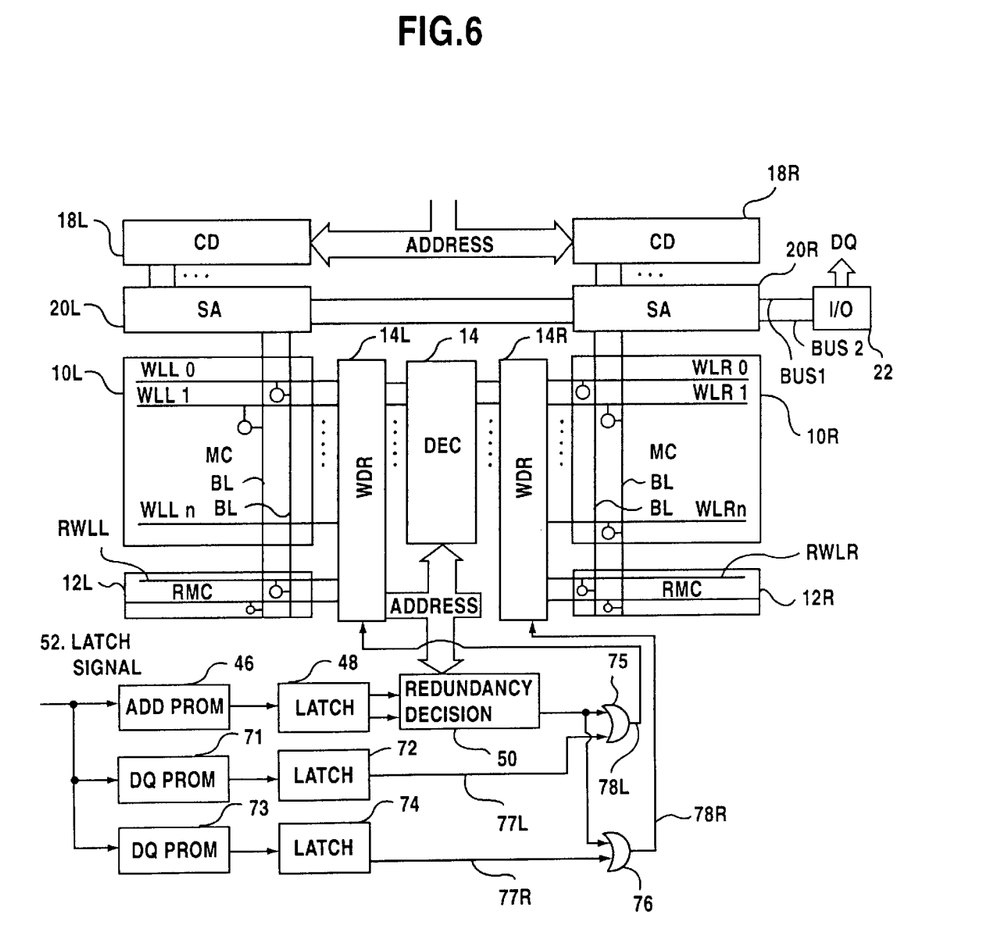
FIG. 6 is a view showing the layout of a single memory cell block of a semiconductor memory device divided in the column direction.

FIG. 6 is a view showing the layout of a single memory cell block of such a semiconductor memory device in which division is effected in the column direction. Reference symbols which are the same as in FIG. 1 are attached to corresponding parts. In this example, output DQ has for example 16-bit output terminals. Of these 16 bits, 8 bits are selected from the left-side sense amplifier 20L and the remaining 8 bits are selected from the right-side sense amplifier 20R. This division is effected for example by a logic structure in which the lower bits are selected from the left side and the upper bits are selected from the right side. Alternatively, the division could be effected by a logic structure wherein odd-numbered bits are selected from the left side and even-numbered bits are selected from the right side.

Let us now provisionally assume that division is effected into lower bits DQ0~7 and upper bits DQ8~15. The memory cell array is divided into left side 10L corresponding to the lower bits and right side 10R corresponding to the upper bits. Likewise the redundant memory cell array is divided into left side 12L and right side 12R. If then for example there is a defect in the word line WLL0 in the left-side memory cell array 10L, this word line WLL0 is substituted by redundant word line RWLL in left side redundant cell array 12L. In this case, data indicating the fact that the lower bits have been substituted by the redundant memory cell array is recorded in PROM 71. Of course, the corresponding addresses are recorded in address PROM 46.

Assuming there is no defect in word line WLR0 in the right-side memory cell array 10R, substitution with redundant cell array 12R is not effected. Data indicating that substitution of the upper bits has not been effected is therefore recorded in PROM 73. Normally this recording is performed by not melting the fuse elements.

If on the other hand there were to be a defect in the word line WLRn in the right-side memory cell array 10R, assuming there is no defect in right-side redundant memory cell array 12R, this defective word line WLRn is substituted by word line RWLR in redundant memory cell array 12R. In this case, the corresponding address is recorded in address PROM 46 and data indicating that the upper bit side has been substituted by redundant cells is recorded in PROM 73. In this case, normally the fuse element is melted.

The data recorded in each PROM is then transferred to the corresponding latch circuit 48, 72 or 74 by means of latch signal 52 that is generated on rise of the power source voltage. Circuit for deciding on redundancy 50 then determines whether the row address that is supplied from outside is the same as the redundant address recorded in latch circuit 48 or not, and if it is in fact the same as the redundant address, its output 79 becomes for example L level. Furthermore, data as to whether the lower bits are substituted in redundant memory cells or not is output from latch circuit 72 to output 77L. Likewise, data as to whether the upper bits are substituted in redundant memory cells or not is output from latch circuit 74 to output 77R. If such substitution to redundant cells has in fact taken place, both outputs 77L and 77R each output L level.

Output 79 of circuit for deciding on redundancy 50 and the respective outputs 77L and 77R are then applied to lower bit redundancy selection gate 75 and upper bit redundancy selection gate 76. If the address coincides with the redundant address and changeover of the lower bits to the redundant cells is designated, output 79 and output 77L are both L level, the output 78L of the OR gate is also L level, and left-side word driver 14L is instructed to effect driving of the redundant side. If the address does not coincide with the redundant address and changeover of the upper bits the redundant cells is not designated, even if output 79 is L level, output 77R is H level, making the output 78R of OR gate 76 become H level. H level of output 78R inhibits right-side word drive 14R from changing over to the redundant cells.

In this way, changeover to redundant cells can be performed for each divided column, by dividing the memory cell array in the column direction (left/right direction in FIG. 6) and for example taking the logical sum of the outputs of circuits for deciding on redundancy, and the output of PROMs recording whether or not changeover to respective redundant cells is to be performed. The loss of efficiency of redundancy referred to above can therefore be moderated to some extent.

Figure 7:
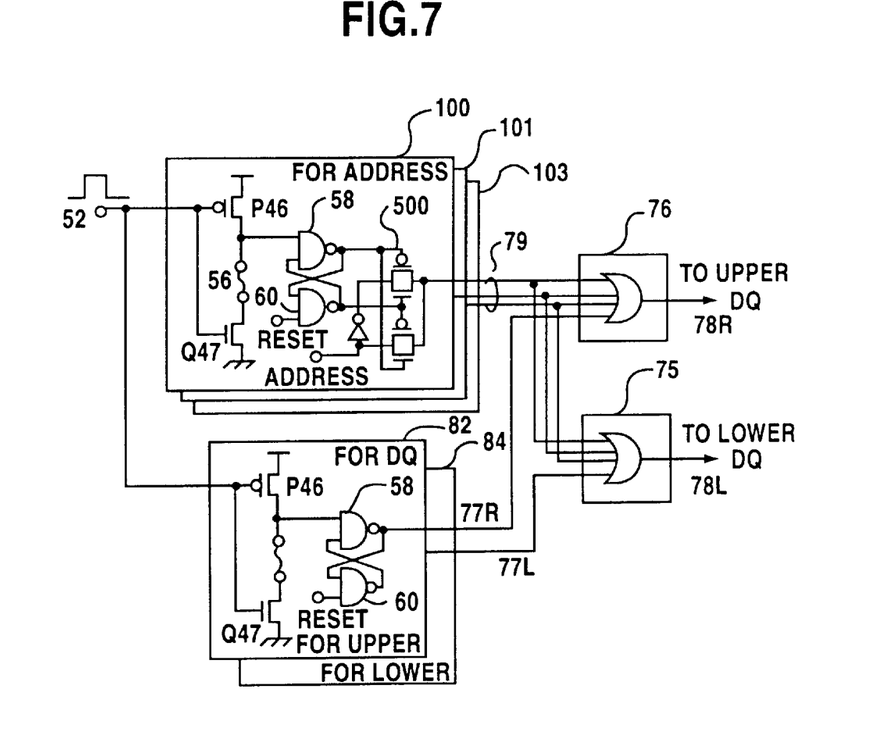
FIG. 7 is a view showing an example of the detailed circuitry of a PROM, latch circuit, circuit for deciding on redundancy and lower/upper bits redundancy selection gate.

FIG. 7 is a view showing an example of the detailed circuitry of the PROM of FIG. 6, latch circuit, circuit for deciding on redundancy, and high/low bits redundancy selection gate. The address PROM circuit, latch circuit and circuit for deciding on redundancy are the same as the circuits shown in FIG. 4; within address bit units 100, 102 . . . there are provided a respective PROM 56, latch circuits 58, 60, and circuit for deciding on redundancy 500.

Also, PROM circuits 71, 73 recording the substitution data of the lower bits or the upper bits and latch circuits 58, 60 are provided within lower side unit 84 and upper side unit 82 respectively. The redundant address and lower bit or upper bit substitution data are latched in the respectively corresponding latch circuits by latch signal 52. The output 79 of the circuit for deciding on redundancy 500 and the output 77L of lower unit 84 are then supplied to OR gate 76 and, if the addresses are the same, causing substitution of the lower side to be recorded, output 78L becomes L level. Likewise, if the addresses are the same, causing substitution of the upper side to be recorded, output 78R becomes L level.

In case where plural sets of defected bit or defected word line can be substituted to the redundancy memory in FIG. 6, plural sets of the circuit shown in FIG. 7 are also provided.

Figure 8:
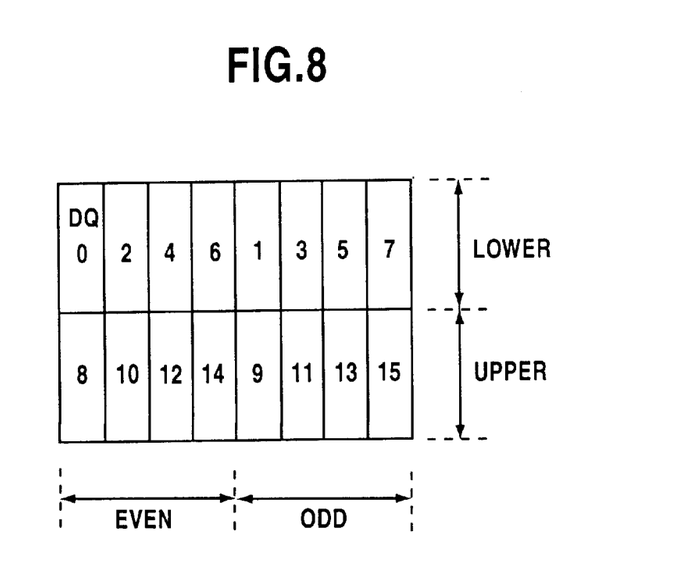
FIG. 8 is a view showing an output bit logic map.

FIG. 8 is an output bit logic map. As described above, the output bits can be divided into upper and lower bits or into even and odd bits. The memory cell array and redundant memory cell array are divided as shown in FIG. 6 in accordance with the divided logic.

In the second embodiment shown in FIGS. 6 and 7, data indicating substitution of the upper bits or lower bits with the redundant address were recorded in PROM circuits and these data were then temporarily latched in an internal latch circuit. However, this embodiment is not restricted to this and improvement in redundancy efficiency can still be obtained even if the data of the PROM circuits are employed for comparison directly without latching, as conventionally.

However, the operation of the circuit for deciding on redundancy can be speeded up by transferring the data stored in the PROMs to an internal latch circuit shown in the first embodiment. Furthermore, as shown in the second embodiment, by dividing the memory cell array in accordance with row address, the size of the circuit for deciding on redundancy can be made smaller and speed can be increased; furthermore, by dividing the memory cell array at the column address side, the lowering of redundancy efficiency that would happen from the division by row address can be prevented.

As described above, with the present invention, no PROM elements such as fuse elements are arranged on the critical path on which the redundancy decision is made, so the overall access time can be shortened since the operational delay of the circuit for deciding on redundancy caused by high-resistance PROM elements is eliminated.

Moreover, a speeding-up of the circuit for deciding on redundancy and high redundancy efficiency can be simultaneously achieved by effecting division of the memory cell array in the output bit direction in addition to the division in the row address direction.

What is claimed is:

1. A semiconductor integrated circuit comprising:
    a PROM element for storing data indicating a redundant address; and
    a data holding circuit for resetting a holding data therein upon power on and holding the data stored in the PROM element on initialization after the power on.

2. The semiconductor integrated circuit according to claim 1, wherein the data stored in the data holding circuit is reset by a reset signal that is generated in response to power on, and the data stored in the PROM element is held in the data holding circuit by a latch signal that is generated in response to an initialization signal applied from outside on initialization of the semiconductor integrated circuit.

3. A semiconductor memory device including a memory cell array and a redundant memory cell array, comprising:
    a PROM circuit for storing a redundant address corresponding to a defective cell in the memory cell array;
    a redundant address data holding circuit for holding the data of the redundant address stored in the PROM circuit on initializing after power on;
    a circuit for deciding on redundancy that compares the data held by the redundant address data holding circuit with a supplied address; and
    a driver circuit for the memory cell array and a driver circuit for the redundant memory cell array that are actuated in accordance with the result of the decision by the circuit for deciding on redundancy.

4. The semiconductor memory device according claim 3, wherein a latch signal is generated in response to a mode register set command supplied from outside on the initialization and the data of the redundant address recorded in the PROM circuit is held in the redundant address data holding circuit in response to the latch signal.

5. The semiconductor memory device according to claim 3, wherein the redundant address data holding circuit is reset upon power on.

6. The semiconductor memory device according to claim 4, wherein the redundant address data holding circuit is reset upon power on.

7. A semiconductor memory device, divided into a plurality of memory cell blocks in accordance with row address wherein the memory cell blocks respectively comprise a memory cell array, a redundant memory cell array and a word driver respectively driving the memory cell arrays and the memory cell array and redundant memory cell array are divided into a plurality in the column direction, comprising:
    a circuit for deciding on redundancy for deciding whether or not a supplied address corresponds to a recorded redundant address; and
    a substitution data holding circuit for holding substitution data indicating substitution/non-substitution to a redundant memory cell for each memory cell array divided in the column direction;
    wherein the word driver drives one or other of the memory cell array or redundant memory cell array divided in the column direction, in accordance with the output of the circuit for deciding on redundancy and the output of the substitution data holding circuit.

8. The semiconductor memory device according to claim 7, further comprising a PROM circuit in which the redundant address is recorded and a redundant address data holding circuit for holding redundant address data in the PROM circuit on initialization, wherein the circuit for deciding on redundancy decides whether the supplied address is an address to be substituted to a redundant memory cell in accordance with the supplied address and the redundant address data held by the redundant address data holding circuit.

9. The semiconductor memory device according to claim 7, wherein the substitution data holding circuit further comprises a PROM circuit in which the substitution data is recorded and a substitution data holding internal circuit that holds the substitution data in the PROM circuit on initialization.

* * * * *